United States Patent [19]

Kelley

[11] 4,302,691
[45] Nov. 24, 1981

[54] INTEGRATED DELAY CIRCUIT WITH PN-JUNCTION CAPACITOR

[75] Inventor: Mark E. Kelley, Worcester, Mass.

[73] Assignee: Sprague Electric Company, North Adams, Mass.

[21] Appl. No.: 102,714

[22] Filed: Dec. 12, 1979

[51] Int. Cl.³ .............................................. H03K 5/13
[52] U.S. Cl. .................................. 307/592; 307/557; 307/605; 357/51
[58] Field of Search ............... 307/592, 141, 597, 605; 361/196; 357/43, 51; 323/285

[56] References Cited

U.S. PATENT DOCUMENTS

| | | | |
|---|---|---|---|
| 3,358,236 | 12/1967 | Weber | 307/605 |
| 3,543,091 | 11/1970 | Marek | 307/592 |
| 4,047,057 | 9/1977 | Ahmed | 307/597 |

Primary Examiner—Stanley D. Miller, Jr.
Assistant Examiner—B. P. Davis
Attorney, Agent, or Firm—Connolly and Hutz

[57] ABSTRACT

In an integrated silicon circuit a PN junction capacitor is charged to almost the full DC power supply voltage through a resistor and through the base-emitter junction of an output transistor. A constant current source and an input transistor switch are simultaneously turned on to dicharge the capacitor at a constant rate, the output transistor being held off until the capacitor is almost fully discharged. The delay, from the time of turning on the constant current source to the time the output transistor turns on, is substantially independent of severe drops in power supply voltage that may occur during this delay period.

7 Claims, 5 Drawing Figures

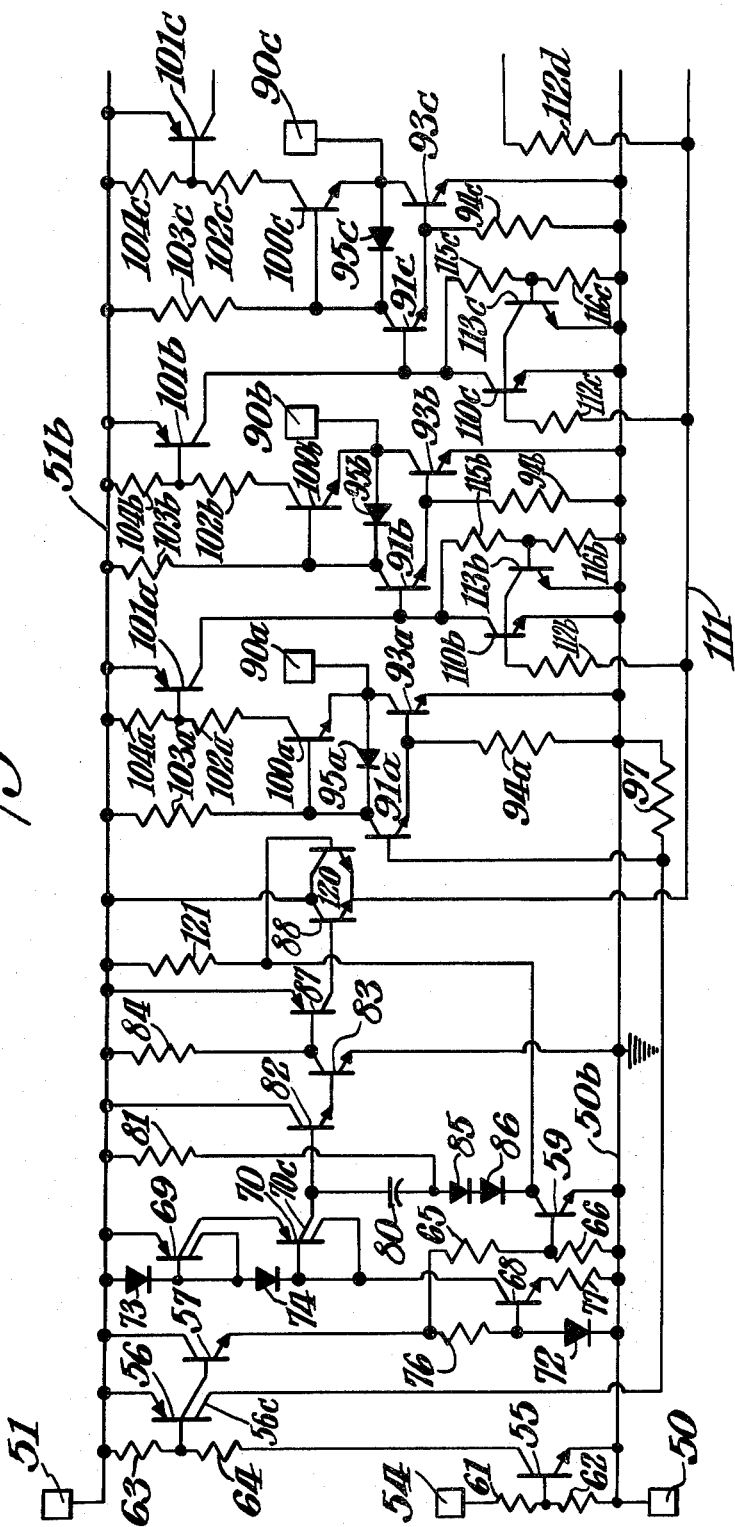

INTEGRATED DELAY CIRCUIT WITH PN-JUNCTION CAPACITOR

BACKGROUND OF THE INVENTION

This invention relates to an integrated silicon circuit for providing signal delay including a PN-junction capacitor and more particularly to such a circuit wherein the capacitor, after being charged to nearly the full power supply voltage, must be almost completely discharged to terminate the delay period.

It is known to employ a resistor-capacitor combination wherein the capacitor is either charged or discharged as an exponential function of time. Such timing or delay circuits usually require the use in a trigger circuit of a threshold voltage that is intermediate the potentials of the two DC power supply busses, and the capacitor is therefore not fully discharged (or charged) at the time of turning on the trigger circuit and terminating the delay period.

It is an object of this invention to provide in a simple low cost integrated circuit a signal delay means wherein the amount of delay is substantially independent of severe drops in power supply voltage during the delay period.

SUMMARY OF THE INVENTION

An integrated silicon circuit includes a PN junction that is adapted to be back-biased and serve as a capacitor. The capacitor is connected to one DC power supply buss through a resistor. The other terminal of the capacitor is connected through the base-emitter junction of a bipolar output transistor to the other DC power supply buss so that the capacitor is charged to almost the $V_{cc}$ voltage that may be applied across the busses. A current source, capable of being gated on and off, is connected between the one buss and the connection between the capacitor and the base of the output transistor. An input transistor switch is connected between the other buss and the connection between the capacitor and the resistor. The current source and the input transistor are adapted to be turned on simultaneously to discharge the capacitor at a constant rate while holding the output transistor off until the capacitor has been almost completely discharged.

An outstanding feature of the timing circuit of this invention is the combination of an integrated timing capacitor that initially becomes fully charged to the power supply voltage, $V_{cc}$, and the upon being discharged, must lose essentially all its charge to trigger the termination of the delay period. The dominant advantage of the above described circuit when using an integrated PN-junction capacitor is that only the simplest standard process steps are required for making such an integrated circuit and a minimum of silicon real estate is required for a given supply voltage ($V_{cc}$) and a given delay time.

Another outstanding feature of this timing circuit is its immunity to malfunction when a large surge of current is drawn from the power supply about simultaneously with the above described input pulse and causes a substantial drop in the DC power supply voltage. In the time delay circuit of this invention the end of the delay period is determined when the timing capacitor has discharged to near zero and applies a voltage to the base of an output transistor at near zero volts relative to the ground side of the power supply to turn on the output transistor. This "threshold" voltage is circuit-wise remote from and essentially independent of the supply voltage.

BRIEF DESCRIPTION OF THE DRAWING

FIG. 5 shows a circuit diagram of another delay circuit of this invention.

DESCRIPTION OF THE PREFERRED EMBODIMENTS

Figure 1:
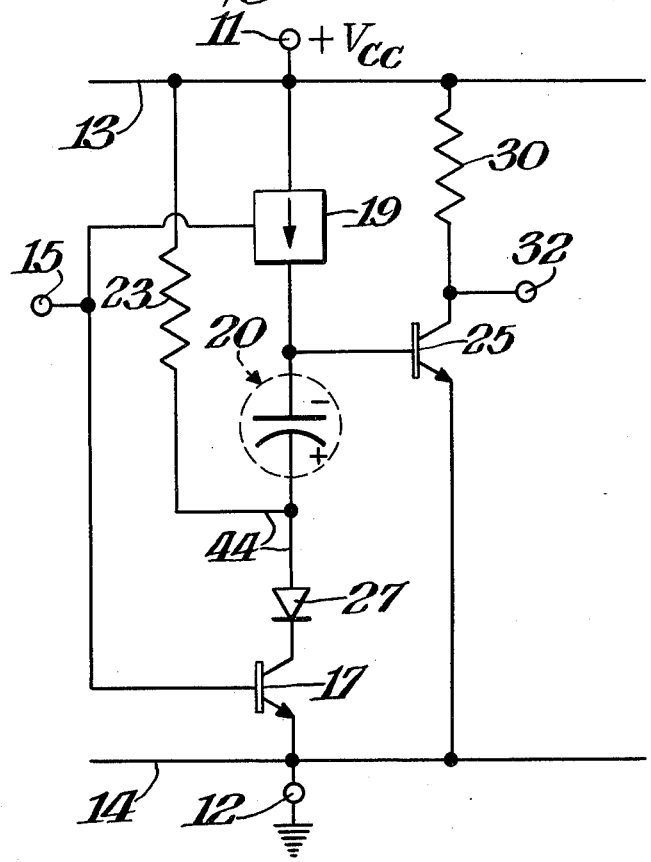
FIG. 1 shows a diagram of a delay circuit of this invention.

The circuit of FIG. 1 operates in the following manner. A DC power supply (not shown) is connected between terminals 11 and 12 so that power supply buss 13 is positive with respect to ground buss 14. With no signal (about zero volts) applied to the input terminal or input conductor 15, the input transistor 17 and the gated current source 19 are off and exhibit a high impedance. The capacitor 20 will therefore be charged to the power supply voltage, $V_{cc}$, through charging resistor 23 and through the base-emitter junction of the output transistor 25.

Figure 3:
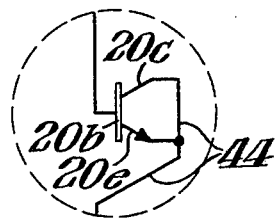
FIG. 3 shows a detail of an alternative circuit diagram of a PN junction capacitor of this invention.
Figure 2:
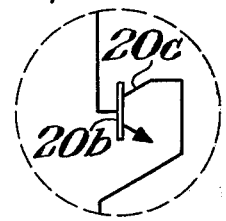
FIG. 2 shows a detail circuit diagram of the PN-junction capacitor of this invention.

The capacitor 20 is a back-biased PN-junction, and may be the base-collector junction of a bipolar integrated transistor as is indicated in FIG. 2. Here the positively charged capacitor electrode is the collector 20c and the other capacitor electrode is the base 20b. Alternatively the capacitor 20 is the parallel combination of the base-collector junction and the base-emitter junction whereby the other capacitor electrode is both the collector 20c and the emitter 20e as is shown in FIG. 3. The use of the base-emitter junction as in FIG. 3 provides a greater capacitance, but when $V_{cc}$ exceeds the breakdown voltage of the base-emitter junction, the connection of FIG. 2 will be preferred.

Now when a step function of positive voltage appears at the input terminal 15 (with respect to buss 14), the constant-current generator 19 is gated on and the input transistor 17 turns on. Referring to FIGS. 1 and 3, the capacitor electrode $20e-20c$ immediately assumes a potential of $$V_{sat_{17}} + V_{d_{27}},$$

where $V_{sat_{17}}$ is the saturation voltage (about 0.1 volts) across transistor 17 and $V_{d_{27}}$ is the voltage (e.g. 0.7 volts) dropped across the diode 27. The capacitor 20 initially holds a charge of $V_{cc}$ (e.g. 6.0 volts). Therefore, at the initiation of an input signal at terminal 15, the voltage at the base of output transistor 25 approaches $$V_{sat_{17}} + V_{d_{27}} - V_{cc}$$

and the base-emitter junction of transistor 25 is strongly reverse biased.

The capacitor 20 begins to discharge at a rate determined by the preselected value of current being delivered from the constant current generator 19. This discharge current path is from buss 13, through constant-current generator 19, capacitor 20, diode 27, and transistor 17 to buss 14. When the charge on capacitor 20 has almost reached zero (e.g. 0.2 volts), the output transistor 25 turns on producing a voltage drop across collector resistor 30. The constant-current from generator 19 holds transistor on for the duration of the input pulse, and an output voltage (of near zero volts) appears at output terminal (or conductor) 32.

When the positive input voltage signal at terminal 15 terminates, the near zero output voltage signal does not terminate. When the positive input signal terminates, the capacitor 20 begins to recharge through resistor 23 and through the base-emitter junctions of transistor 25. When the capacitor 20 is fully charged, then the transistor 25 turns off and the output signal terminates. The circuit is then fully recovered so that another positive input pulse will cause the cycle described above to repeat itself.

Figure 4:
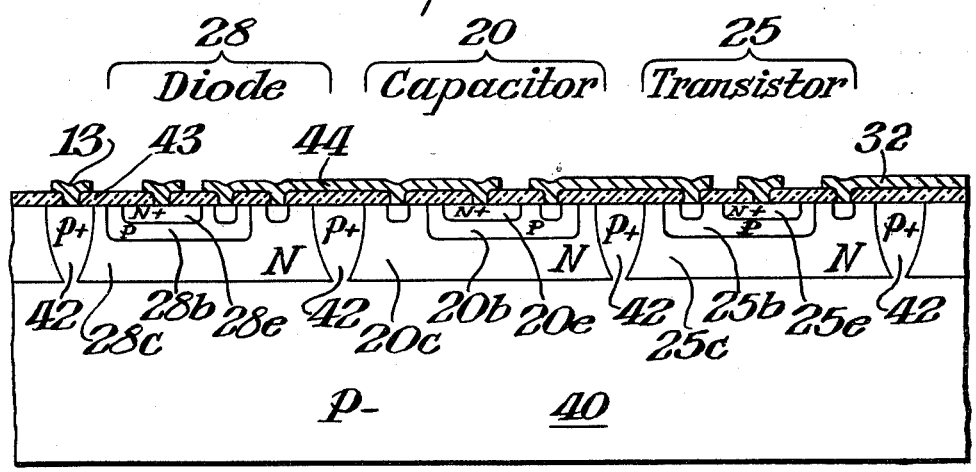
FIG. 4 shows in side sectional view a portion of an integrated silicon circuit of this invention corresponding to the circuit shown in FIGS. 1 and 3.

The integrated circuit structure in FIG. 4 includes a silicon chip 40 having been lightly doped with P-type impurities. An N-type epitaxial layer is then grown over the surface of chip 40 and isolation walls 42 are formed by the selective and heavy doping of this epitaxial layer to form therein N-pockets 20c, 25c and 28c. Then there are formed in these pockets shallow P-type regions, 20b, 25b and 28b, which serve as the negatively charged electrode of the capacitor 20, the base of transistor 25 and the anode of diode 28, respectively. Shallower regions 20e, 25e and 28e, respectively, are formed in the shallow P-type regions by diffusion through a mask of N-type impurities. A protective insulating layer 43 is formed over the surface of the chip 40, wherein holes are provided and aluminum strips are deposited by a vacuum metallization process to provide electrical connection to the various diffused regions, to interconnect the various components and to form terminal pads. All of the process steps required are conventional and well known.

With reference to FIGS. 1, 3 and 4, the regions 20e and 20c whose structural features are shown in FIG. 4 serve together as the positively charged electrode of capacitor 20. The diode anode region 28b in FIG. 4 is shown connected to the positively charged electrode of capacitor 20, namely regions 20e and 20c, by means of metallized aluminum strip 44.

Experimental photo-flash-control integrated circuit chips were made and tested. The circuit diagram of FIG. 5 shows a portion of this circuit which operates as follows. A 6 volt battery (not shown) is connected between terminal pads 50 and 51, negative to positive, respectively. The PN-junction capacitor 80 charges and is back-biased to 6 volts through charging resistor 81 and the base emitter junctions of transistors 82 and 83. The integrated circuit is attached to a camera (not shown) so that when the shutter is triggered, a momentary short (of at least 1000 micro-seconds) is placed between input terminal pad 54 and the positive power supply terminal 51. The transistors 55, 56, 57 and 59 forming an amplifier in conjunction with resistors 61, 62, 63, 64, 65 and 66, are turned on by the trigger pulse from the camera shutter. A gated current source is made up of transistors 68, 69 and 70 in conjunction with diodes 72, 73 and 74 as well as resistors 76 and 77. This current source also turns on at the initiation of the shutter opening.

When transistor 59 first turns on, the voltage at both terminals of the capacitor 80 drop by about 5 volts (the power supply voltage minus the sum of the forward drops of diodes 85 and 86 and the saturated transistor 59). The capacitor 80 now commences to be discharged by the constant current of about one microampere amplitude from collector 70c of transistor 70. The discharge path from capacitor 80 to the ground buss 50b consists of diodes 85 and 86 and the "on" transistor 59. Thus, after a delay of about 60 microseconds from the initiation of the shutter trigger, transistors 82 and 83 turn on producing an output step or voltage drop across collector resistor 84. Transistors 87 and 88 also turn on.

The remainder of the circuit in FIG. 5 consists of three photo-flash amplifiers and associated control circuitry to insure that one and only one unfired flash bulb fires each time the camera shutter is opened. The flash bulbs are of the incinerating foil type that appear as a very low electrical impedance or short circuit before and during firing, and appear open after firing. Three flash bulbs (not shown) are connected to the positive power supply buss 51b from terminal pads 90a, 90b and 90c, respectively.

The photo-flash bulb amplifier for the bulb at terminal 90a consists of transistors 91a and 93a as well as resistor 94a and diode 95a. When the camera shutter opens, the collector 56c of transistor 56 is raised to near 1.8 volts, raising the voltage at the connection between resistor 97 and the base of transistor 91a to turn on transistor 91a. Thus power transistor 93a provides a very low impedance from terminal 90a to ground buss 50b, and fires the first flash bulb. Power transistors 93a, 93b, etc. are made in accordance with the power transistors described by Genesi in pending application Ser. No. 929,759 filed July 31, 1978, and assigned to the same assignee as is the present invention. The flash of light and the electrical short of the bulb itself last about a millisecond during which the control circuit, made up of transistors 100a, and 101a as well as resistors 102a, 103a and 104a, is all at about 6 volts and inoperative, i.e. the transistors 100a and 101a are off.

The second photo-flash amplifier input is at the base of transistor 91b, and can not be turned on except by turning on transistor 101a. This is clearly prevented during the firing of the bulb at terminal 90a. However, the connection of terminal 54 to the positive buss 51b by the shutter typically lasts for several milliseconds and is still operative after the approximately 1 millisecond flash of the bulb at terminal 90a. Thus, just after the flash bulb at terminal 90a becomes an open circuit, transistors 100a and 101a turn on and threaten to fire the flash bulb at terminal 90b.

To prevent such multiple firing, an inhibit transistor 110b is turned on by applying a positive voltage from an inhibit buss 111 through resistor 112b. The inhibit buss 111 is activated from transistor 88 beginning about 60 microseconds after the initiation of camera shutter opening.

Thus, after having successively fired a number of flash bulbs, the next to be fired must be fired through a large number of transistors and the propogation delay of the firing signal may be several tenths of microseconds. The 60 microsecond delay circuit described above turns on the inhibit transistors, 110b, 110c, etc., only after the firing signal has had time to reach and fire the furthermost and last flash-bulb (not shown).

Another problem occurs when for example the second flash-bulb is being fired, i.e. at terminal 90b. After 60 microseconds the inhibit line 111 is activated, and transistor 110b turns on, cutting short the firing of the flash bulb at terminal 90b. This is prevented by inclusion of the transistor 113b and resistors 115b and 116b. Transistor 113b is turned on at the first moment transistor 101a goes on and prevents the subsequently applied (after 60 microseconds) positive inhibit voltage from turning on 110b at all during that firing cycle. Transistor 113b thus has an anti-inhibit function. When transistor 113b is on, transistor 110b can not be turned on. When transistor 110b is turned on, transistor 113b can not be turned on.

Thus, there are associated with each photoflash bulb (e.g. to be connected at terminals 90a, 90b, 90c, etc., respectively) a group of circuit components that in FIG. 5 are assigned numerals 91 through 116. Those associated with the first photo-flash terminal 90a are further identified by the letter "a", the second terminal 90b, by the letter "b" and those associated with the third photo-flash terminal by the letter "c". Circuit elements with the same numeral have the same function. Many more such photo-flash stages may be added beyond those shown in FIG. 5.

As has been explained, transistor 88 turns on and activates the inhibit line at the end of the delay period i.e., after the capacitor has discharged to near zero charge and transistor 82 begins to conduct. Resistor 121 keeps transistor 120 turned on except when the shutter is open and transistor 59 is on, thus preserving the activation of the inhibit line except during the delay period.

What is claimed is:

1. An integrated silicon circuit providing signal time delay comprising:
   (a) a pair of DC power supply busses;
   (b) a bipolar output transistor having an emitter that is non-resistively connected to one of said busses, and having a collector that is connected through an output load to the other of said busses;
   (c) a bipolar input transistor having an emitter non-resistively connected to said one buss, and having a base connected to an input conductor, said emitters of said bipolar transistors having the same impurity polarity type as is the intended voltage polarity of said one buss relative to said other buss;
   (d) a PN junction to serve back-biased as a capacitor having one electrode connected to the base of said output transistor, the impurity polarity-type of said one electrode being the same as that of said output transistor base;
   (e) a capacitor-charging-resistor being connected between said other buss and the other electrode of said capacitor;
   (f) at least one diode being connected in a series circuit with said input transistor, collector to emitter, in such a polarity as to conduct at the same time that the base-emitter junction of said input transistor conducts, said series circuit being connected between said other capacitor electrode and said one buss; and
   (g) a gated current source means being connected between said other buss and said one capacitor electrode, the gate control portion thereof being connected to said input conductor, for discharging said capacitor at a predetermined rate when said input transistor is conducting, whereby said capacitor must be about completely discharged before said output transistor begins to conduct.

2. The integrated circuit of claim 1 wherein said PN-junction is comprised of the base-emitter junction of a third bipolar transistor.

3. The integrated circuit of claim 2 wherein said PN-junction is additionally comprised of the collector-base junction of said third transistor, the collector and emitter of said third transistor being connected together.

4. The integrated circuit of claim 1 wherein said non-resistively connected emitters are connected to said one buss by means of metallic conductors.

5. The integrated circuit of claim 4 additionally comprising a fourth bipolar transistor being connected in Darlington relationship with said output transistor, so that there exist two base-emitter junctions in series from said one capacitor electrode to said one buss, and additionally comprising a second diode connected in said series circuit with said at least one diode.

6. An integrated silicon circuit providing signal time delay comprising:
   (a) a positive and a negative DC power supply buss;
   (b) a PN junction diode capable of serving as a capacitor when back-biased;
   (c) a charging resistor connecting said positive buss to the cathode of said diode;
   (d) an NPN output transistor connecting the anode of said diode through its base-emitter junction to said negative supply buss in a direction for charging said capacitor;
   (e) a switching means for electrically opening and closing a low impedance path between said cathode and said negative buss; and
   (f) a gatable constant-current source means for delivering a constant current from said positive buss to said anode of said diode only during the period of said closing of said switching means to discharge said capacitor of said back-biased diode at a constant predetermined rate, whereby said output transistor turns on after a predetermined period of time delay from the first instant of said closing.

7. An integrated silicon circuit providing signal time delay comprising:
   (a) a positive and a negative DC power supply buss;
   (b) a PN junction diode capable of serving as a capacitor when back-biased;
   (c) a charging resistor connecting said negative buss to the anode of said diode;
   (d) a PNP output transistor connecting the cathode of said diode through its base-emitter junction to said positive supply buss in a direction for charging said capacitor;
   (e) a switching means for electrically opening and closing a low impedance path between said anode and said positive buss; and
   (f) a gatable constant-current source means for delivering a constant current from said negative buss to said cathode of said diode only during the period of said closing of said switching means to discharge said capacitor of said back-biased diode at a constant predetermined rate, whereby said output transistor turns on after a predetermined period of time delay from the first instant of said closing.

* * * * *